United States Patent [19]

Linnenbrink et al.

[11] 4,393,357

[45] Jul. 12, 1983

[54] HIGH SPEED TRANSIENT RECORDER SYSTEMS

[75] Inventors: Thomas E. Linnenbrink, Winnetka; David A. Gradl, Des Plaines, both of Ill.

[73] Assignee: Q-Dot, Inc., Des Plaines, Ill.

[21] Appl. No.: 231,292

[22] Filed: Feb. 4, 1981

[51] Int. Cl.³ .................. G11C 27/00; H01L 29/78; G11C 11/40
[52] U.S. Cl. ............................ 333/165; 357/24; 333/202; 365/183; 377/63
[58] Field of Search ............ 333/165, 166, 202, 204; 357/24, 24 LR, 51; 307/221 D; 364/724, 824, 862; 365/183

[56] References Cited

U.S. PATENT DOCUMENTS

| 3,975,753 | 8/1976 | Bharat | 333/165 X |
| 3,992,716 | 11/1976 | Distefano | 357/24 |
| 4,080,581 | 3/1978 | Sakaue et al. | 333/166 X |
| 4,290,118 | 9/1981 | Stern et al. | 357/24 LR X |

Primary Examiner—Marvin L. Nussbaum
Attorney, Agent, or Firm—Fitch, Even, Tabin, Flannery & Welsh

[57] ABSTRACT

CCD methods and devices for recording transient data signals, in which charge is transferred under the influence of transmission line fields at sampling sites disposed along a charge transfer channel.

12 Claims, 20 Drawing Figures

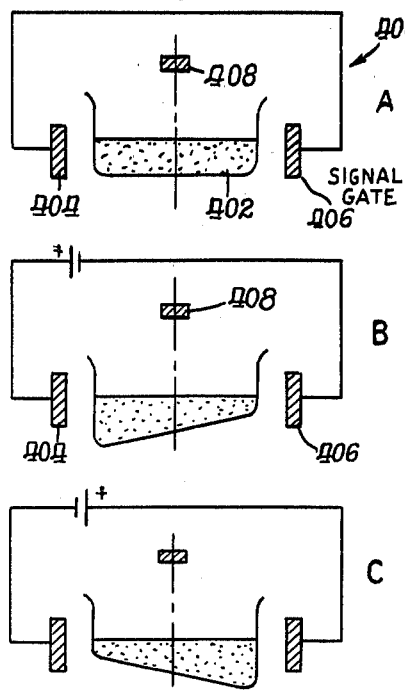
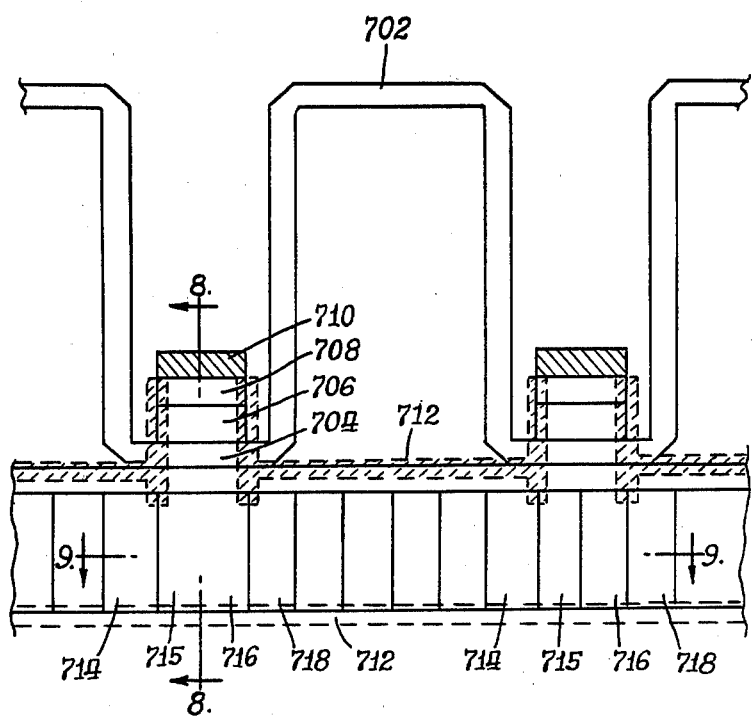
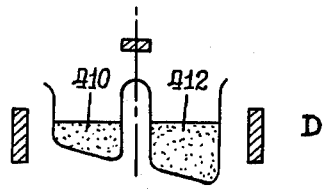
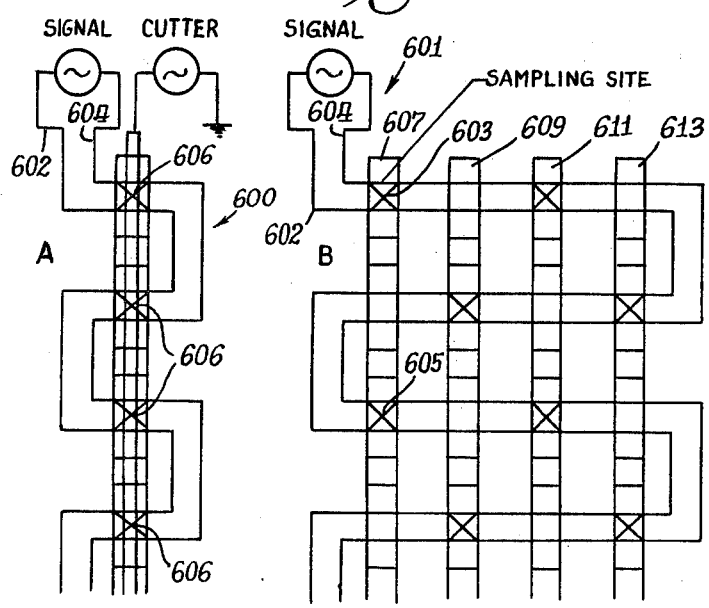
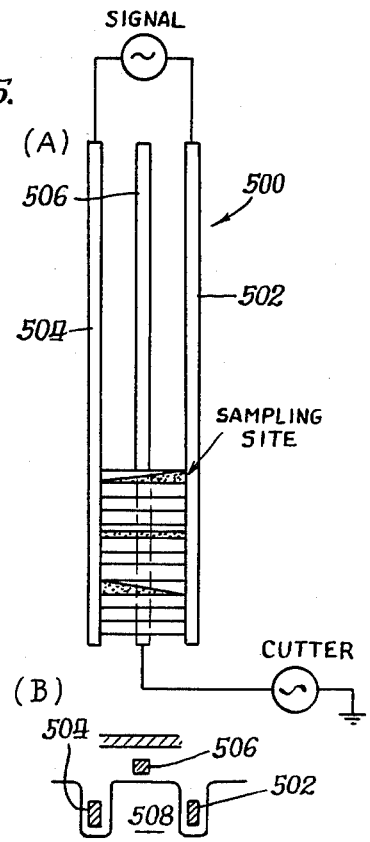

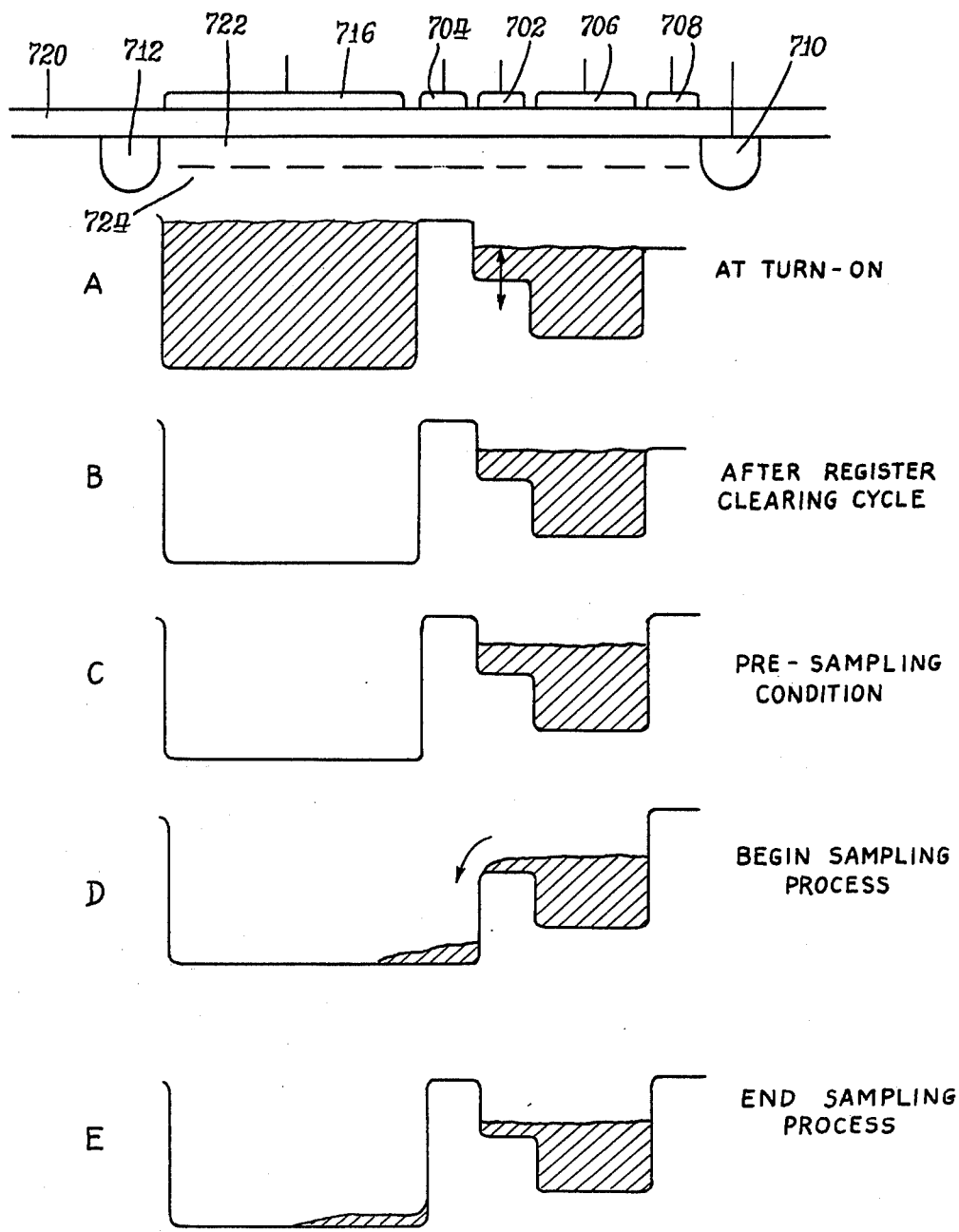

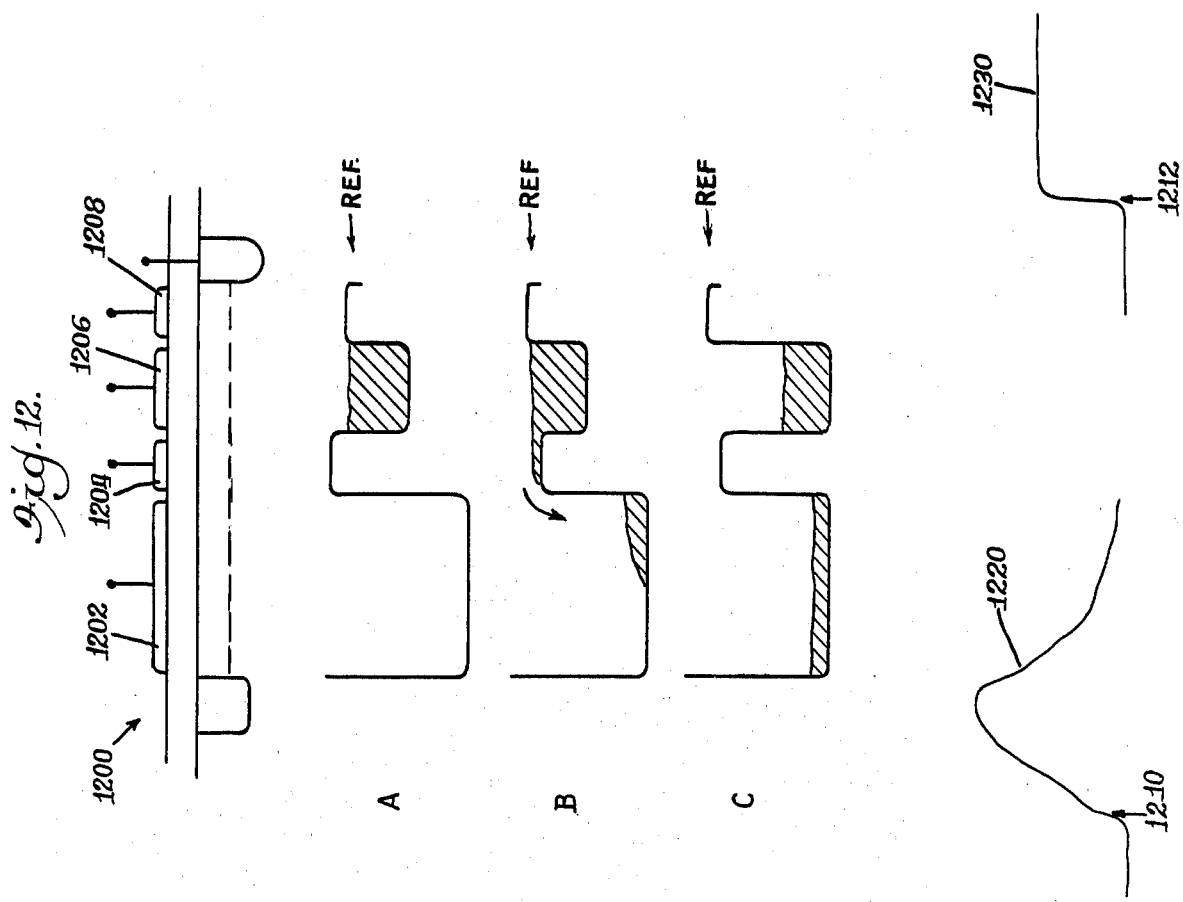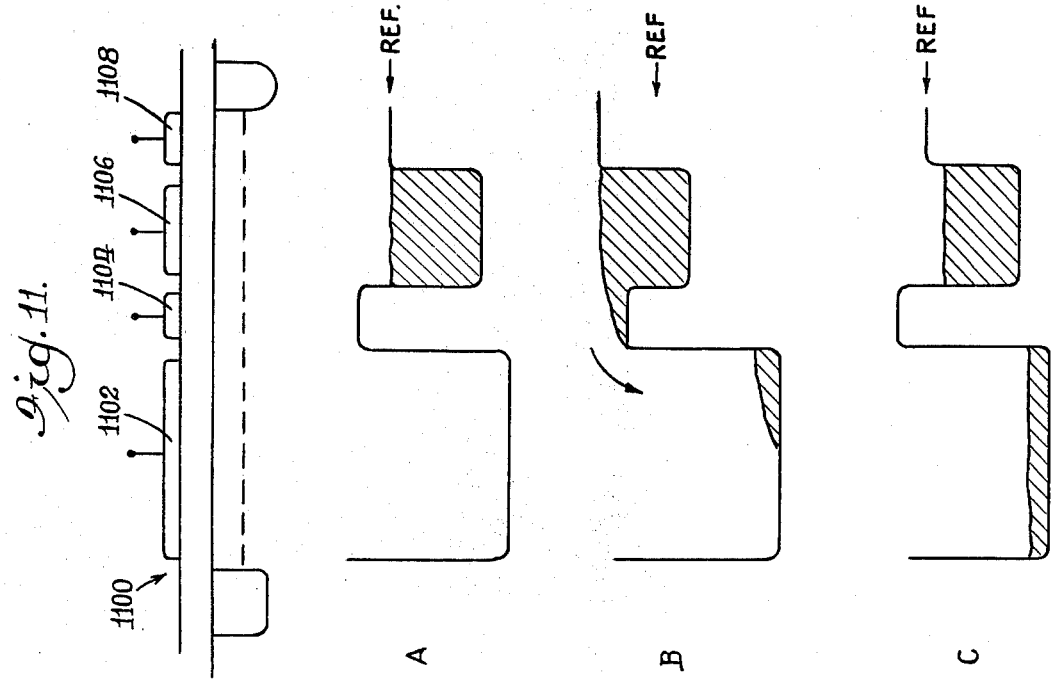

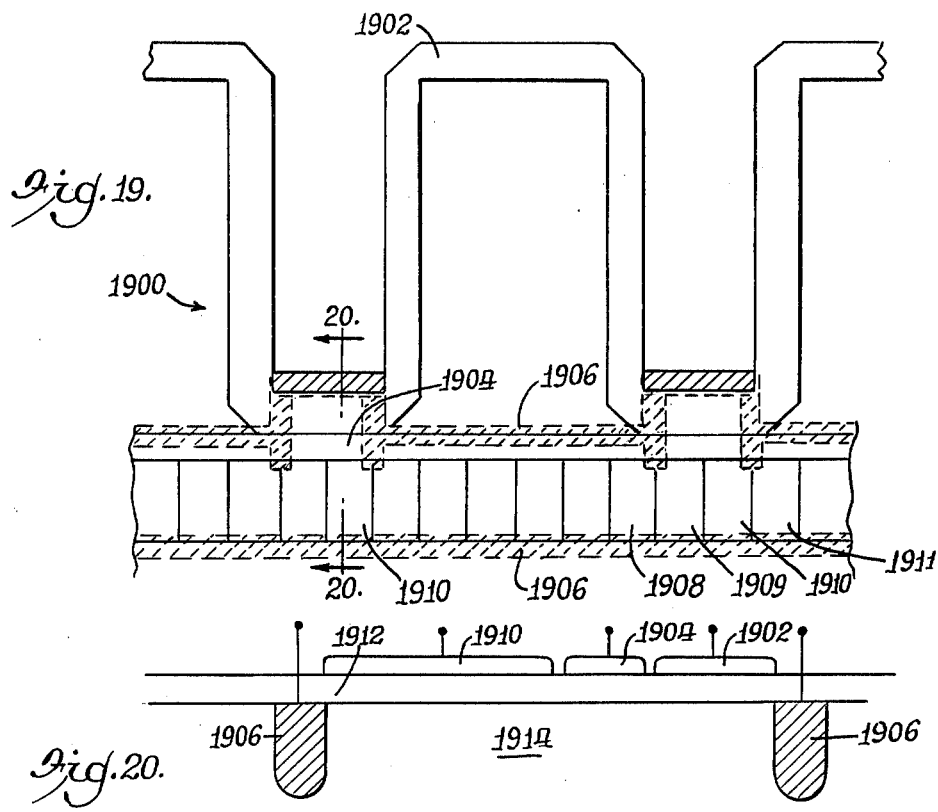
Fig. 19.
Fig. 20.
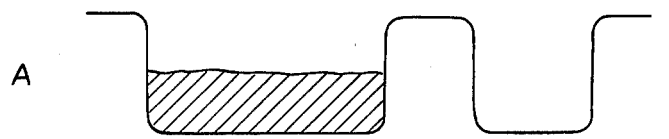
A
B
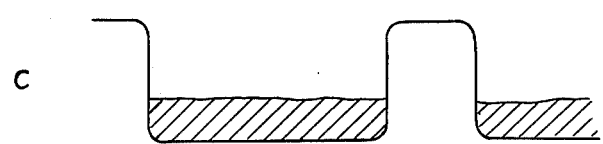
C
D
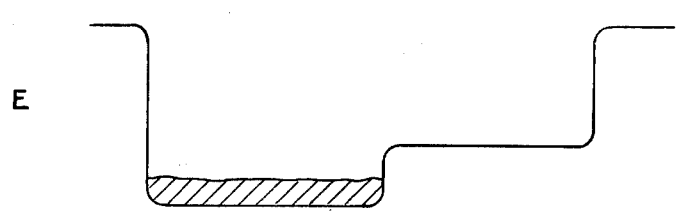
E

HIGH SPEED TRANSIENT RECORDER SYSTEMS

The present invention is directed to methods and devices for high speed transient data recording, and more particularly, is directed to high speed signal sampling integrated circuit devices of the high speed charge coupled device type, and to methods for utilizing such devices.

The recording of wide bandwidth transient data by computer-compatible instruments has presented a significant challenge to instrumentation developers. Transient data (i.e., any high-bandwidth data, particularly including noncyclic or nonrepetitive data, in a low-bandwidth background) has been recorded with cameras mounted on oscilloscopes. The resulting photographs may then be digitized with manual or semi-automatic equipment. A conventional variation of the traditional recording oscilloscope, the scan converter, replaces the oscilloscope face with an electronically read storage matrix. Such systems have significant cost and performance limitations.

Conventional direct digital transient recorders are also known in which filtered, continuous analog data is sampled, digitized and stored digitally in real-time. Such direct digital transient recorders similarly have significant cost and performance limitations.

Transient data recorders have also used high speed charge coupled devices (CCD's) to provide a dual-speed analog buffer. Full-rate, sampled analog data (i.e., discrete-in-time, continuous-in-amplitude data) are shifted into the CCD in a charge-equivalent-to-signal form at the full sampling rate, which may typically be five times the bandwidth. Data are continuously shifted in until a trigger stops the process. The trigger can occur before, during or after the event of interest. Once the event is captured, the data may be shifted out of the CCD at a slower rate [Y. J. Chan, et al., "Extremely High Speed CCD Analog Delay Line", Proceedings of 1975 International Conference on the Application of Charge-Coupled Devices, San Diego, Calif., Oct. 29–31, 1975, pp. 389–398; D. A. Gradl, et al., "High Speed Operation of CCDs", ibid., pp. 399–412; T. E. Linnenbrink, et al., "A CCD-Based Transient Data Recorder", ibid., pp. 443–453; J. W. Balch, et al., "A CCD Integrated Circuit for Transient Data Recorders", Proceedings of Conference on Charge-Coupled Device Technology and Applications, Washington, D.C., Nov. 30–Dec. 2, 1976, pp. 115–119; and T. E. Linnenbrink, et al., "A One Gigasample per Second Transient Recorder", IEEE Transactions on Nuclear Science, Vol. NS-26, No. 4, August, 1979, pp. 4443–4449]. However, further improvements in transient data recording, particularly in respect to methods and apparatus for extremely high frequency signal sampling, would be desirable.

In this connection, there is a need for signal sampling devices which operate at extremely high frequencies, and which may be made available to the general scientific community. The development of such systems has presented substantial difficulty in the art.

Accordingly, it is an object of the present invention to provide methods and apparatus which are particularly adapted for very high bandwidth operation. It is a further object to provide new integrated circuit devices, and methods for utilizing such devices, which are particularly adapted for extremely high speed signal sampling. These and other objects of the present invention will become more apparent from the following detailed description and the accompanying drawings, of which:

FIGS. 4A, 4B, 4C and 4D are schematic cross sectional side views of a partitioning charge carrier cell embodiment illustrating carrier redistribution under a signal field;

FIGS. 5A and 5B are top, and cross sectional views, respectively, of a colinear array integrated circuit charge partitioning embodiment of a very high speed signal sampling device;

FIGS. 6A and 6B are, respectively, single and multichannel orthogonal integrated circuit charge partitioning embodiments of very high speed signal sampling devices;

FIG. 7 is a top view of two charge cell units of a portion of a metering charge partition integrated circuit embodiment of a very high speed signal sampling device;

FIG. 8 is a cross sectional side view, taken through line 8—8, of the device of FIG. 7, together with schematic representations A, B, C, D and E of various operational states of the device;

FIG. 11 is a cross sectional side view, like that of FIG. 8, of an alternative embodiment of the device of FIG. 7, together with schematic representations A, B and C of various operational states of the device;

FIG. 12 is a cross sectional side view, like that of FIG. 8, of another embodiment of the device of FIG. 7, together with operational state representations A, B and C illustrating another mode of high speed signal sampling operation with data and control gate signals of the general type there shown;

FIG. 19 is a partially schematic top view, like that of FIG. 7, of another embodiment of the present invention; and FIG. 20 is a cross sectional side view of the device of FIG. 19, taken through line 20—20.

Figure 1:
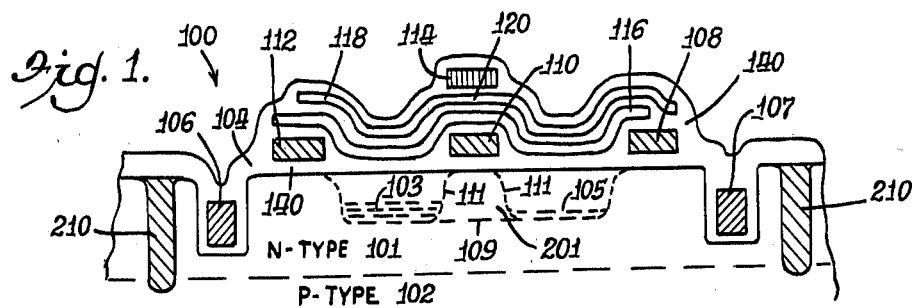
FIG. 1 is a cross sectional view of a charge partitioning integrated circuit embodiment of the present invention taken through line 1—1 of FIG. 2, and which is generally in registration with FIG. 2.

In accordance with various aspects of the present invention, data may be acquired and recorded utilizing small, signal-dependent shifts in charge carriers contained in a plurality of potential wells of a charge-coupled device under the influence of the electromagnetic field of a transient data signal propagated along a transmission line associated with the potential wells.

In accordance with various device aspects of the invention, integrated circuit devices are provided for recording high frequency analog transient data signals, which comprise charge transfer channel means for providing a plurality of charge potential wells at a plurality of sampling sites disposed along a charge transfer channel, and for transferring charge carrier packets along the channel. Various electrode configurations may be utilized to provide charge wells and charge transfer. In order to provide rapid charge carrier response, buried channel architecture is particularly desirable, and is particularly preferred as will be appreciated from the following description, although surface channel designs might be constructed for certain applications. Similarly, the highest mobility carrier will most preferably be utilized; in the case of devices fabricated from monocrystalline silicon wafers, electrons are particularly preferred as charge carriers for the devices. The devices further include transmission lines disposed (at least in part) along said transfer channel means at the sampling sites, for receiving and propagating a transient data signal to be recorded to each of said plurality of sampling sites, and for providing an electric field at each of the sampling sites representing the potential of the transient data signal at each respective sampling site. The signal is propagated sequentially to the sampling sites, and is distributed along the transmission line means, and hence the sampling sites, at any given instant in time.

The devices further include means for transferring charge carriers in respect to said charge potential wells as a function of the transient data signal field provided by said transmission line means at each of said respective sampling sites, and for measuring the charge transferred at each sampling site as a function of the transmission line field at such sites. By transferring charge carriers at a predetermined time, the time-potential representation of the transient data signal may be recorded by means of the charge carrier transfer under the influence of the t-line fields.

In various preferred embodiments, a packet of charge carriers may be partitioned under the influence of the t-line fields, and in various embodiments, the charge carriers may be metered into potential wells under the influence or control of the t-line fields.

In accordance with method aspects of the present invention, high frequency transient data signals may be recorded by providing a plurality of charge wells at a plurality of sampling sites in charge transfer communication with a charge transfer channel. Further in accordance with such methods, a transient data signal to be recorded is propagated along a transmission line sequentially to each of the sampling sites to provide a representation of the transient data signal in time along the transmission line and to produce an electric field at each of the sampling sites representing the potential of the transient data signal at each respective sampling site. Further in accordance with such methods, charge carriers are transferred to charge potential wells at the respective sampling sites under the influence of the transient data signal field provided at each of said sampling sites.

In this manner, the transient data signal may be recorded as a function of quantity of charge of a series of charge carrier packets which may be transferred out of the charge transfer channel and measured in an appropriate manner. It is a particular advantage of various of the methods in accordance with the present invention that very high speed sampling intervals may be provided for in device design, but input and output charge transfer functions, as well as transfer of charge packets along the transfer channel, need not be carried out at high speeds. Further in accordance with the invention, uniform charge packets may be transferred at each of the signal sites, under t-line signal field influence, or the charge may be varied at each sampling site to provide for on-chip signal processing function such as correlation sampling and/or error correction.

Multiple, charged shift-and-split cells may be configured to produce a family of high-speed data acquisition devices, various embodiments of which are set forth in the following disclosure.

One embodiment of a sampling site cell of an n-channel, buried-channel CCD t-line structure is diagrammed schematically in FIG. 4 to indicate its operation. A packet of charge 402 (electrons) has been positioned in the charge potential well or cell 401 defined laterally in a charge transfer channel by suitable lateral containment gates (not shown) on each side and longitudinally (i.e., normal to the plane of FIG. 4) by charge transport gates (not shown). In FIG. 4A, the charge 402 is shown at equilibrium without signal applied. A potential applied to the transmission line signal gates 404, 406 will provide an electric field through the charge 402, disturbing the initial equilibrium of the charge in the potential well. Charge 402 will then proceed to shift laterally until equilibrium is restored in the presence of the signal field, resulting in a new charge distribution similar to those shown in FIGS. 4A and 4B. To assess the extent of this signal-induced charge redistribution, the packet is split into copackets, ideally along the line-of-centers indicated in FIG. 4, by applying a step signal to a cutter gate 408. The two copackets [FIG. 4D] are then transported via conventional charge propagation techniques to circuitry, which may be entirely of conventional design, to resolve the number of carriers in each copacket. A static calibration of carriers in copackets as a function of applied DC signal potential may serve as a steady state reference for dynamic effects.

Dynamic data to be recorded may be applied across the lateral signal plates 404, 406. With the cutter gate 408 provided with a potential such that the potential well under it is down, charge 402 continuously redistributes itself within the cell 400, tracking the data. When sampling is desired, the cutter gate is raised abruptly, partitioning the charge packet into a plurality of packets 410, 412 [FIG. 4D]. The dynamic response of the cell 400 as a signal sampler is then related to several key mechanisms including: charge tracking of signal field, cutter partitioning characteristics, and discrimination of differences between copackets. A brief overview of these fundamental characteristics will indicate their interaction.

Most desirably, charge would redistribute instantaneously in response to any change in signal field. In fact, it requires time to move from one position to another. The amount of time required is a function how fast the carriers move and how far they must move to restore equilibrium. Carrier velocity is related to a number of well known conduction phenomena within semi-conductors [C. H. Sequin, et al., Charge Transfer Devices, Academic press, 1975], including mutual replusion, thermal diffusion and external fields. In order to establish strong electric field dependence within the charge packet, the region should best be lightly doped and relatively sparsely populated with carriers. Under these conditions, carrier velocity will be strongly field dependent. A brief table of electron drift velocity in lightly doped silicon (i.e., impurity concentration, N of about $10^{16}$) as a function of electric field at room temperature (approx 25° C.), is set forth as follows [J. S. Moll, Physics of Semiconductors, McGraw-Hill, 1964]:

| Electric Field v/cm | Electron Velocity nm/ps |
|---|---|
| 100 | 1.8 |
| 200 | 3.2 |
| 500 | 7.0 |
| 1000 | 12 |
| 5000 | 45 |
| 10000 | 70 |
| 20000 | 100 |

To approximate the electric field generated by signal applied to the lateral plates 404, 406 for purposes of discussion with respect to FIG. 4, the potential function may be regarded as a linear ramp between the plates so that the electric field is uniform between the plates. If instantaneous tracking is a desirable limit, carrier velocity is to be maximized. High velocity requires strong electric field. For a given potential, the electric field between plates 404, 406 is increased by decreasing plate spacing, which also has the advantage of minimizing the average distance carriers must traverse to restore equilibrium for a given potential charge. However, a minimum limit on plate spacing is imposed by the need to split the charge packet with a cutter gate potential driven from a cutter gate of finite width, and utilizing conventional processing technology, a plate-to-plate spacing of 10 μm may readily be provided. A one volt potential between plates 404, 406 produces a field of:

$$E = 1V/10^{-5}m = 1000 V/cm$$

Likewise, a 5 V signal would result in 5000 V/cm. These fields correspond respectively to electron velocities of 12 nanometers per picosecond (nm/ps) for 1000 V/cm and 45 nm/cm for 5000 V/cm. For purposes of discussion, it is assumed as a crude model that the distance traversed by the centroid of carriers 402 as the carriers re-equilibrate represents the average carrier path length. If the doping profile within the region of interest is controlled to shape the charge packet 402 at various potentials to control the centroid shift as a function of signal potential. A noise-limited dynamic range 1000:1 may be provided for conventional CCD structures, if a charge centroid shift at 10% of the well width represents a full-scale signal potential, then a 0.1% change may be considered to represent the detectable limit, but still yield a signal range of 100:1 or $6^{30}$ bits. Likewise, the same 0.1% change relative to a 1% full-scale shift yields a 10:1 signal range or 3+bits. In the simplest terms, if a carrier shift occurs without significantly changing the position of carriers relative to one another, then a fractional volume change will correspond to an equal fractional displacement of the carriers laterally between the signal plates. For the assumed 10 μm plate spacing, the carriers might occupy the central 5 μm. Then a 10% shift with respect to the center line suggests a 0.5 μm average carrier path length. Likewise, a 1% shift implies a 0.05 μm path. By approximating the charge shift and reequilibration to an exponential function, much like the response of an RC network to a step change in potential, the carrier velocity as a function of initial electric field will be approximated to the initial slope of the exponential, with average distance along the carrier path to the new static equilibrium point being the asymptote. The intercept of the initial slope with the asymptote yields the following cell time constant, $\tau$, estimated on this basis for a 1 V full scale design and a 5 V full scale design:

| First order estimate of cell time constant ($\tau$) | | | |
|---|---|---|---|
| Full-Scale Potential Step | Initial Carrier Velocity | Time-constant, for average carrier displacements of: | |
| | | 0.5 μm | 0.05 μm |
| 1V | 12 nm/ps | 42 ps | 4.2 ps |
| 5V | 45 nm/ps | 11 ps | 1.1 ps |

Settling times as a function of $\tau$ may be suggested for cells respond exponentially, for example, settling to within 1% requires 4.6$\tau$. In the frequency domain, such simple exponential modelling results in a simple pole with 6 db/octave rolloff and a carrier frequency (−3 db point) at $(2\pi\tau)^{-1}$. From the previous table, a time constant, $\tau =$ 42 ps implies 1% settling in 193 ps and a corner frequency of 3.8 GHz while $\tau = 1.1$ ps implies 1% settling 5.1 ps and a corner frequency of 145 GHz.

These first order approximations are presented for general consideration in respect to the schematically illustrated embodiment of FIG. 4.

More refined tracking and charge splitting modeling is appropriate to various of the following specific embodiments of devices in accordance with the present invention. Arrays of charge partitioning or metering cells may be configured in a variety of ways to form a transient recorder system. In one arrangement, a colinear structure of cells is provided in which the signal to be recorded follows along the charge propagation path. In another type of structure, the signal crosses the charge path orthogonally at the sampling cell sites. The signal to be recorded may follow a serpentine path so that signal propagation time may be varied in respect to the transmission channel geometry.

A colinear array system 500 is schematically illustrated in FIG. 5, and comprises a linear charge channel array including "signal plates" 502, 504 which are merged to form a parallel plate transmission line along the charge transfer channel. Transmission lines of the colinear array 500 may be fabricated to utilize a very lightly doped (e.g., $N = 5 \times 10^{15}$) polysilicon in accordance with conventional fabrication techniques, which polysilicon lines have a propagation velocity of about 0.36 that of light in free space. If the "plates" 502, 504 shown in FIG. 5 are 2 μm high and the effective distance between them is 10 μm, a characteristic impedance of about 120 ohms may be produced. A data acquisition sequence of the device 500 is:

(1) Meter uniform charge packets (e.g., by fill-and-spill technique); and shift the metered charge packets into charge channel and stop.

(2) Individual charge packets, maintained in a single potential well at each sampling site are then subjected to the lateral electric field generated inside the signal t-line at the positions respectively adjacent each sampling site, and dynamically track the signal under the influence of the signal fields provided by the t-line at each sampling site.

(3) When sampling is desired, a sharp step (e.g., 20 ps, 10 V) is transmitted down the t-line formed by the continuous cutter gate 506 and the substrate 508. It splits the packets into copackets. Travelling opposite to the direction of the signal, the sharp step signal causes sampling to occur at twice the period of the CCD structure.

(4) The copackets may then be shifted by the CCD structure in a conventional manner into signal processing circuitry designed to detect and quantize the difference in copackets.

It will also be appreciated that non-uniform charge packets may be metered into the sampling site potential wells for certain processing applications such as signal correlation processing. In this regard, for example, charge packets representing points of a desired correlation signal may be metered into the device 500, in order that the output response of the sampler 500 may produce a correlation function of the correlation signal and the transient signal transmitted along the t-line.

Four-phase, buried channel CCDs such as those suitable for device 500 of FIG. 5, are commonly built with 5 μm gates yielding 20 μm (0.8 mil) data cells, which at the wave speed in both the signal and cutter t-lines 502, 504, 506 causes the cells to be traversed at 0.2 ps intervals. Since the transient signal and the cutter step signal move in opposite directions, the sampling interval is 0.4 ps. A practical limitation on record length is imposed by the length of practical devices in silicon. A convenient length is 250 mils, yielding, on the order of 250 cells for a 100 ps record, although larger CCD structures may be constructed. A one inch long CCD structure would yield 1000 cells and a 400 ps record, but transmission line losses, particularly at very high frequencies present increasing difficulties with increased device length.

Orthogonal or serpentine arrays may also be utilized to provide for increased signal delay between sampling sites without increasing the device length. An orthogonal array partitioning structure 600 is illustrated in FIG. 6, which separates the signal t-line from the path of the charge channel. In that manner, larger sampling intervals independent of CCD pitch may be realized. In a simple form shown in FIG. 6A, the parallel transmission lines 602, 604 for signal cross data cells 606 at or between its gates, and a fringing field is generated in the normal charge transport direction. Adjacent packets of charge are merged under each t-line crossing and the combined charge is driven by signal field. When sampling is desired, a partition between cells is raised in response to a cutter step. A wide variety of configurations of this sort are possible yielding considerable extremes in sampling interval and number of samples.

A re-sampling orthogonal array 601 as shown in FIG. 6B may also be formed if the charge packets are moved from one sampling cell 603 to the next sampling cell 605 during the sampling process. If the signal delay along the t-line between sampling sites is matched to the charge propagation velocity of charge transport along the CCD channel, then the same charge packet may exposed to the same signal at each cell as it progresses down the CCD transfer channel. An advantage of such a device is that settling time is enhanced by the number of cells mutually encountered. That is, if $0.1\tau$ settling is permitted at each cell, $10\tau$ settling is attained after 100 cells. While it would appear that sampling intervals are restricted by the CCD propagation, multiple channels (e.g., 607, 609, 611, 613) can be employed. Also the cutter gate function can be implemented geometrically as an unclocked channel stop with windows at each sampling cell for certain types of orthogonal cells.

Coplanar t-lines, microstrip over ground plane t-lines, superconducting t-lines and balanced t-line structures may be used in various of the embodiments. In general, however, it will be appreciated that particular attention should be provided to t-line design, both on and off-chip, in order to avoid or minimize signal losses, dispersion or impedance discontinuities. Superconducting t-lines are virtually lossless, even at high frequency. The operation of CCD structures at very low temperatures increases carrier mobility, but is disadvantageous from a practical operational standpoint. Coplanar t-lines have excellent transmission characteristics, and may be particularly desirable as on-chip leads or segments serpentine between sampling sites.

Figure 2:
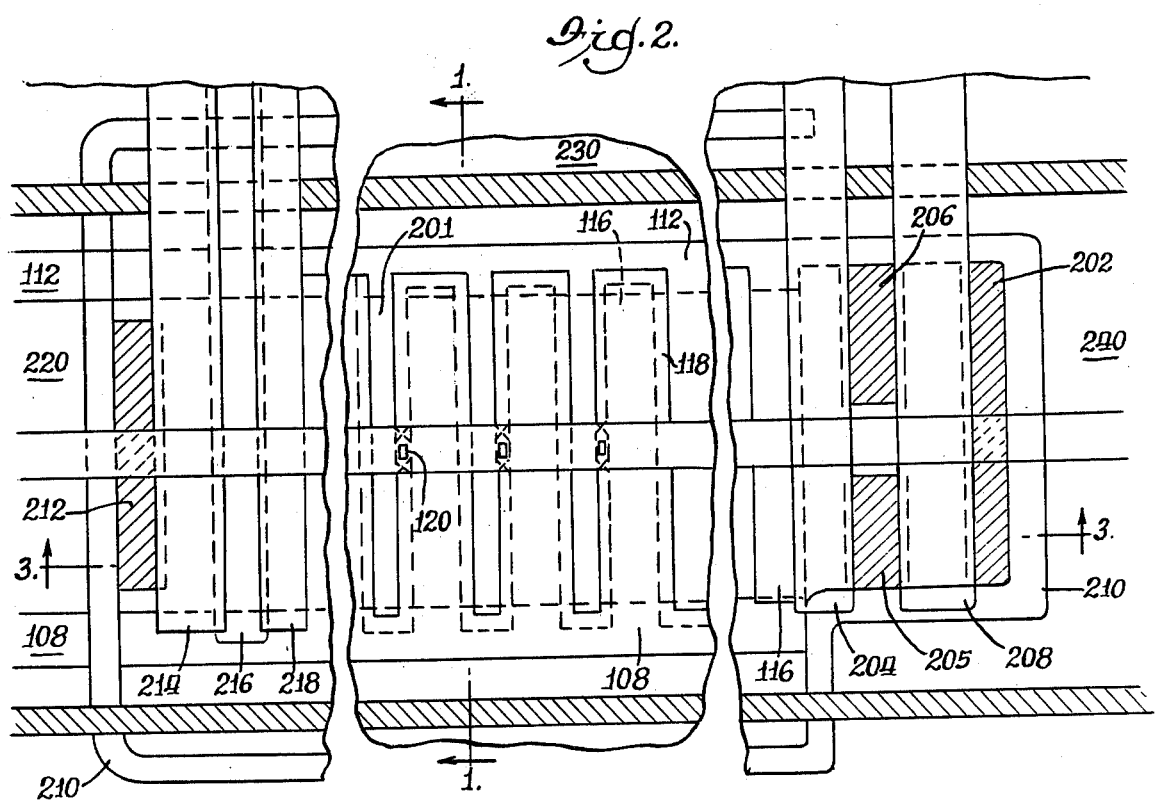
FIG. 2 is a top view, partially broken away, of the charge partitioning integrated circuit device of FIG. 1.
Figure 3:
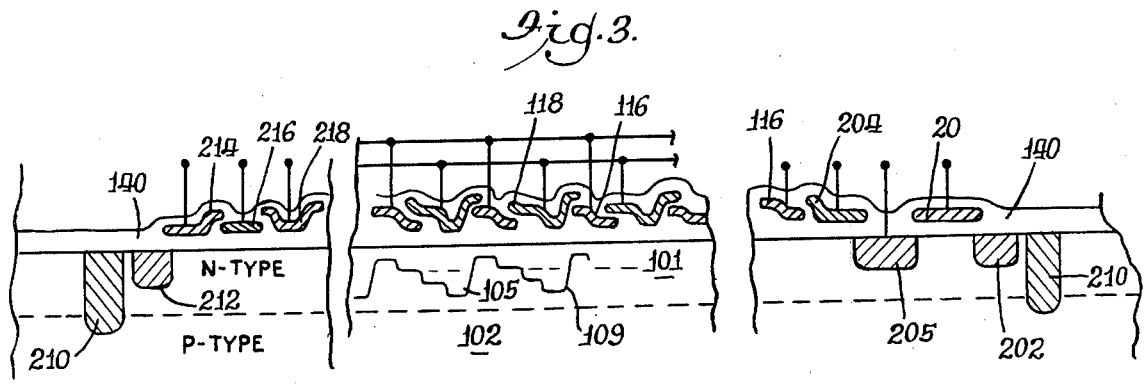
FIG. 3 is a cross sectional view, partially broken away, of the charge partitioning integrated circuit device of FIG. 1, which is taken through line 3—3, generally in registration with FIG. 2.
Figure 9:
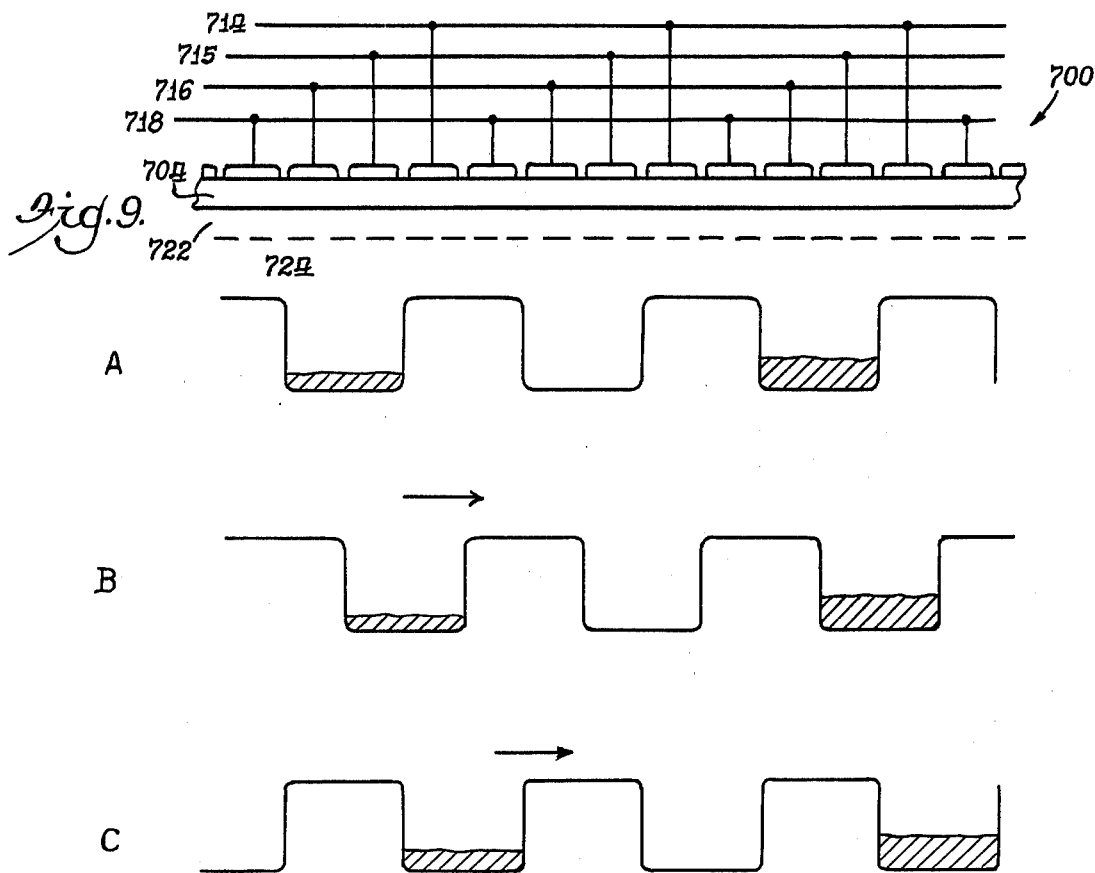
FIG. 9 is a partial, longitudinal cross sectional view of the device of FIG. 7, taken through line 9—9, together with schematic representations A, B and C of various operational states of the device.

Turning now to FIGS. 1-3, a colinear device 100 of the field-tracking, charge partitioning type is there illustrated. FIG. 1 is an end view of the charge coupled device 100 having an appropriately disposed parallel transmission line for influencing the position of charge in a plurality of charge packets disposed along the transfer channel 201 of the CCD device 100. The illustrated structure utilizes a buried channel charge coupled device structure in which charge (electrons) is moved as packets down an n-type substrate 101 by suitable propagation gates, which in the illustrated embodiment are two phase propagation gate arrays 116, 118.

In FIG. 2, which is a top view of the device 100, partially broken away to depict an input structure 220 at the bottom of the figure, a centrally located charge partitioning CCD channel structure 200 which may be repetitively extended to a desired length (only a few of the sampling stages being shown for economy of space), and an output structure 240. The CCD transfer channel is laterally defined by confinement gates 108, 112. Polysilicon channel confinement gate structure 108, 112 are provided to define the longitudinal sides of the buried channel CCD transfer channel to create potential barriers which contain charge under gates 116, 118 when provided with an appropriate DC bias. The CCD channel structure includes two phase transfer or propagation gates 116, 118 for maintaining charge potential wells in the channels, and for transferring charge along the channel in potential wells under control of appropriate clock signals.

The propagation gates 116, 118 comprising a lower gate 116 and an upper gate 118, which may be fabricated of polysilicon and separated by appropriate oxide dielectric 140 in accordance with conventional practice, are best seen in FIGS. 2 and 3. As best seen in FIG. 3, the transport gating elements comprising lower gate 116 and upper gate 118 are conventional two phase CCD transport electrode architecture utilizing an oxide step configuration to induce a potential ramp to facilitate two phase operation. A schematic representation of the potential wells produced by the electrodes at one phase of the two phase operation is shown in FIG. 3 at 109. The transport electrodes 116, 118 are DC biased such that the charge 103, 105 is vertically centered in the bulk channel formed in n-type silicon layer 101 with respect to the buried signal field lines 106, 107 in order to maximize the field influence of the transmission lines 106, 107 on the charge.

A typical device such as the device 100 will be provided with a central transport and partitioning channel region which is several hundred stages long, depending on the application and the number of signal samples desired. In FIGS. 1–3 (and subsequent figures), various of the components shielded from direct view by overlying components, particularly including the electrode structures and the manner in which the vias 120 connect the sandwich structure for the cutter gate, being shown by dotted line. In this regard, the via structure of the cutter gate means permits use of a polysilicon layer 110 adjacent the transport channel, and a highly conductive (e.g., aluminum) overlay layer 114, which structure provides for rapid, low impedance transmission of the squarewave cutter gate step pulse.

As indicated, an input structure 220 is provided to meter out generally uniform packets of charge, and in this regard, a fill and spill structure, such as that illustrated or other conventional CCD input structure may be used. Cutter gate 110 extends the full length during charge packet inputting operations, and in one mode of operating the device 100, it may be biased "low" (i.e., of relatively high potential for a buried channel n-type channel CCD, to provide a "low" potential well) so that the two sides of the channel act as one channel. The cutter gate 110 may also be biased "high" so that the CCD is separated into separate charge transport channels.

As best shown in FIG. 1, the charge channel structure is shown in both its "raised" 111 and "lowered" positions 109, which are determined by the bias potential of the cutter gate 110. In its lowered position, the gate 110 provides a continuous flat equipotential channel (side to side) across the device, as illustrated by dotted line 109 of FIG. 1 In its raised position, two potential wells are established at each sampling site along the channel under the electrode 110.

The illustrated charge input means 220 may meter generally uniform charge packets into the CCD channel, which may be then clocked into the device at a conveniently low rate (e.g., 100 kilohertz) under the control of transport electrodes 116 and 118, which are operated synchronously with the input structure. When the device 100 has been fully loaded, having one packet of charge in each sampling cell, the transport clocking on gates 116 and 118 is stopped, leaving the charge packets in the respective wells along the central partitioning section of the device 100. At this time, the gate 110 is in its "lowered" position so that charge resides in a single potential well and is free to move in the well under the influence of electric field influence. A transient signal to be measured may then be applied to electrodes 106 and 107 as a balanced signal. At the time it is desired to sample this signal being applied to 106 and 107, a sharp edge pulse is applied to electrode 114, which in turn propagates the pulse through the vias 120 to the polysilicon cutter gate 110, longitudinally adjacent the CCD charge transfer channel, to the charge packets at each point along the transmission line. A suitable generator which produces a clean, sharp edge, (e.g., 20–200 picosecond rise time) for passage across the device 100, such as a tunnel diode generator, step recovery diode generator, or avalanche transistor driver may be utilized to apply a suitable cutter pulse to the electrode 114. Upon onset of the trigger pulse to the cutter gate, the cutter gate step signal propagates along the array of charge partition sample cells, to separate the potential well into two potential wells as shown in FIG. 1 by lines 111. Because the sampling is initiated by a single pulse which travels sequentially along the CCD sampling cells, the sample to sample timing is well defined by propagation times inherent in the structure and very repeatable.

Turning now to FIGS. 2 and 3, the input and output structures for the CCD element 10 will now be described in more detail.

The output structure 240 is adapted to provide separate outputs for each of the charge transfer channels isolated by action of gate 110. Output transfer gate 204 is an electrode to which the output charge of both channels is transferred before it is dumped into the n-type floating output diffusions 205, 206. When the charge is transferred to output diffusion 205 (or 206), the voltage change on that diffusion is sensed and brought to an on-chip output FET amplifier (not shown) to provide a voltage output proportional to the charge dumped onto that output diffusion. Overlapping the output diffusions 205, 206 is reset gate element 208. After charge has been dumped onto the output diffusion 205, more positive voltage is applied to gate 208 which then causes conduction of the charge of the element 205 into n-type reset sink diffusion 202. As soon as the charge is completely transferred from output diffusion 205 to sink diffusion 202, gate 208 can be turned more negative to voltage, thus eliminating the conduction path. Output diffusion 205 is then ready to accept and measure a new packet of charge. The output structure is clocked with the transfer electrodes 116, 118 in accordance with conventional practice.

In the embodiment 10 of FIGS. 1–3, each partitioned charge packet is measured, and in this regard, two separate output systems are provided. Thus, output diffusion 206 and a second FET output amplifier (not shown) is provided for outputing the other partitioned charge packet of a charge packet pair. Thus, output diffusion elements 205 and 206 are the two floating output diffusions for the two CCD channels which are utilized in device 100 to bring out the charge packet pairs for each data point in the sampling structure. While the embodiment 100 has dual output structures 205, 206, it is also contemplated that a single output structure with multiplexed outputs from the two channels might be utilized.

The device 100 is provided with a channel stop 210 which in the illustrated embodiment is a heavily doped p-type diffusion penetrating the n-type epitaxial layer 101 to the p-type substrate 107, and which will preferably substantially completely surround the CCD structure to contain the charge within the CCD channel, although it may be desirable to reduce or minimize proximity to the t-lines 106, 107 (which may themselves be constructed to provide a charge barrier). The channel stop 210 functions to remove thermal leakage charge generated outside the perimeter of the CCD, to prevent it from entering the CCD channel region where signal charge is contained.

The inut structure for the illustrated embodiment 10 may be of a conventional input structure design such as a fill and spill buried channel CCD input structure, although other input structures may also be used. In the illustrated embodiment, an n-type input diffusion 212 is supplied which is provided with a suitable off-chip input potential. Adjacent to the input diffusion 212, an isolation gate 214 is provided, and adjacent the isolation gate 214 is provided a spill control gate 216 which regulates the amount of charge that is spilled back out of storage electrode gate element 218.

In operation, the input diffusion 212 is pulsed negatively and injects electrons across the isolation gate 214, the spill control gate 216 and into the storage electrode gate 218 such that charge is accumulated across all three of the gate structures 214, 216, 218. When the negative input pulse, which is then applied to input diffusion 212, ends the charge is allowed to drain back into the diffusion 212. The potential under spill control electrode 216 is more negative than under storage electrode 218 thereby preventing all the charge from draining out from under electrode 218 such that a predetermined quantity of charge is held in the potential well under storage electrode 218 which is proportional to the difference in potentials under electrodes 216 and 218. This quantity of charge then measured under storage electrode 218 is ready for transfer into the CCD transfer channel 201. By the serial transferring process effected by the operation of the two phase CCD transfer gates 116, 118 in conventionally appropriate phase relationship with the operation of the charge input means, this predetermined amount of charge may be loaded into each cell within the CCD by the two phase transport electrode drivers of the illustrated embodiment. The input clocking of the input charge packets may then be stopped after the sampling site wells are filled, to render the device 100 ready to sample a desired signal. An appropriate driver is provided for the input diffusion 212, which pulses and initiates the charge flooding into the three gate regions following the diffusion, and is provided in accordance with conventional practice. The illustrated output structure is similarly provided with an additional drive signal applied to the reset gate 208 which determines when the charge is removed from the floating output diffusions 205, 206. The output electrode 204 is similarly provided with an appropriate DC bias in accordance with conventional practice.

As indicated, the signal to be sampled is applied as a balanced input to the transmission line formed by conductor lines 106 and 107. Transmission lines 106, 107 may be fabricated of aluminum for high conductivity, and form a reasonably classical parallel transmission line. The cutter gate is of "sandwich", or layered construction, with the lower portion 110, which is closest to the charge being a polysilicon gate which is stitched periodically by means of vias 120 [FIG. 2] to an overlayed aluminum gate 120 that runs along the center of the CCD transport channel. This combined structure forms a microstrip over ground plane like a transmission line in conjunction with the substrate (which is ground), and therefore will support a fast cutting edge step potential signal traveling down the center of the CCD channel. In one method of operation, as previously discussed, the signal to be sampled will propagate in one direction with respect to the CCD transfer channel, and the cutter gate signal will propagate in the other. Electrode 110 should be relatively narrow with respect to the width of the transfer channel and the length of the transfer electrodes 116 and 118, so that proper charge separation is maintained between successive packets.

The illustrated lines 106, 107 of the device 100 are also output from the device 100 (rather than being terminated on the device), so that the signal may be monitored after passage across the device 100. The other high speed signal applied to the device 100 is the cutter gate driver signal which is applied to electrode 114, and is propagated between the polysilicon gate 110 and the substrate. The cutter gate electrode is similarly also provided with external output connection, rather than being terminated on the device 100, so that the cutter gate signal may be monitored after passage across the device 100.

In operation of the device 100, the gates 116, 118, which may be clocked at relatively low speed (e.g., 100 kHz) by conventional propagation drivers, may be used to initially bring charge packets of predetermined uniform size into the CCD structure. The two phase clocking is then stopped so that the charge resides statically inside the structure, in discrete wells regularly disposed along the CCD transfer channel 201. A balanced signal to be recorded may then be applied across lines 106, 107 which form a balanced transmission line immediately adjacent the charge packets, which are disposed therebetween. The electric field created by the electric potential between lines 106 and 107, moves the charge in the CCD well 109 laterally between electrodes 106 and 107, such that the charge distribution tends to physically track the potential field generated by the transmission line formed by lines 106, 107. In this connection, prior to sampling, the potential well is shown schematically by dotted lines 109, and the charge is free to move from side under the influence of the transient signal applied to lines 106, 107. To sample the signal transmitted along lines 106, 107, the cutter gate 110 potential is raised through the charge in the CCD, splitting it into two packets, as shown in FIG. 1 by potential well lines 111, and partitioned charge packets 103, 105. Cutter signal 114 is a negative signal which causes the wells to separate, as illustrated in FIG. 1. The transfer electrode clock signal voltages applied to gates 116 and 118 may be conventional signals, such as 10 volt (approx.) squarewave signals. The charge apportionment residing in those two packets is a function of the field applied by the transmission lines 106, 107 immediately prior to the cutter gate partitioning it into two charge packets 103, 105. In order to provide good field coupling of the transmission line field into the charge packets prior to sampling, the transmission lines 106, 107 are recessed into the substrate so that the strongest electric field lines between the lines 106, 107 pass through the charge packets disposed along the CCD channel 201. The recessing may be of the illustrated "U" type, or may be more readily fabricated in a "V" groove (with some increase in field modeling difficulty or effective field strength). In the illustrated embodiment 100, a very lightly doped substrate 101 is used such that a relatively small number of carriers are present, to minimize inhibition of the field lines along the transmission lines 106, 107.

As also indicated, conventional two phase CCD propagation drive signals are applied to the device 100 in a conventional manner. The n-type channel 101 of the illustrated device may be of suitable depth and width to the particular device (e.g., 5 microns). Electrodes 106 and 107 may be deposited at a depth of 3 to 3.5 microns, so that the charge center is for example, 2 microns deep and centered between the t-line electrodes 106, 107.

After the charge is partitioned, the potential of the cutter gate 110, 120 is held "high" (i.e., made more negative for a buried n-channel CCD) in its partitioning mode, and the charge is propagated along the transfer channel by means of the two phase electrodes 116, 118. However, with the cutter gate "high", there are now two completely separate charge channels for propagating charge out of the device 100, which are separately output from the illustrated device 100. By means of a differential amplifier or other suitable means, the amount of charge in adjoining co-packets are compared, and from which the potential field in the transmission line at each sampling site at the time of sampling determined by the time of crossing of the cutter gate step signal, may be determined. It will also be appreciated that non-uniform charge packets may be metered into the CCD transfer channel in a predetermined manner, for signal correlation or correction purposes as previously discussed.

Figure 10:
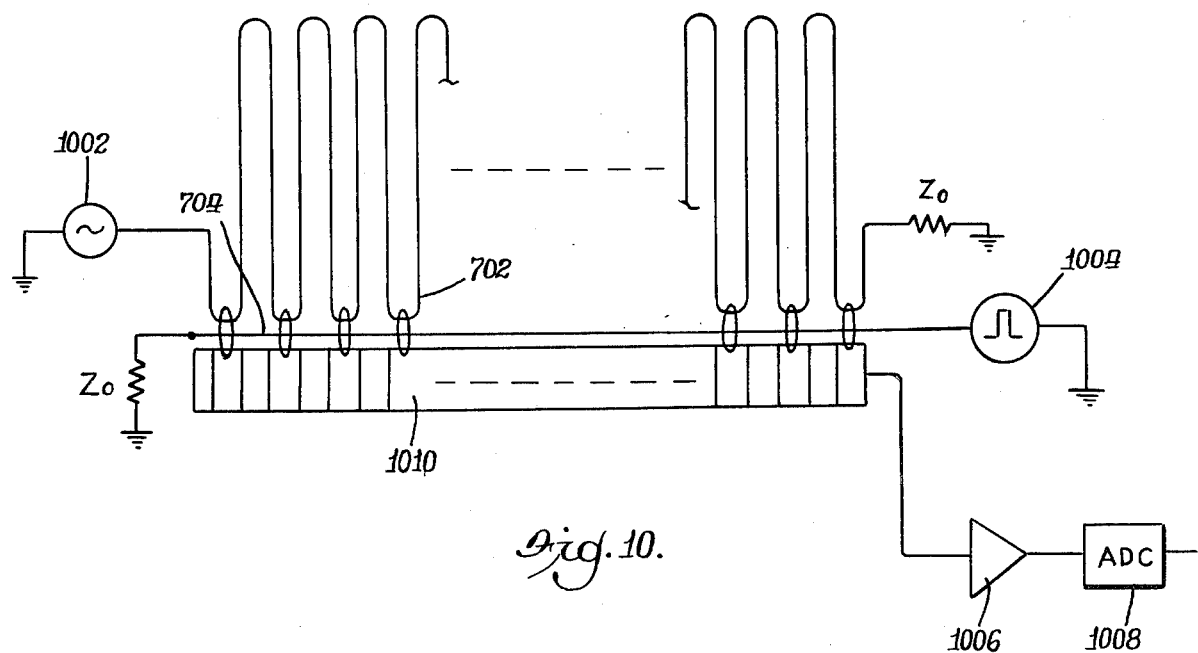
FIG. 10 is a schematic representation of the device of FIGS. 7, 8 and 9 together with external circuitry forming a transient data recorder.

Methods and devices in accordance with the present invention are also provided in which a quantity of charge may be metered into a plurality of sampling site potential wells under the unfluence of electric fields of a serpentine transmission line in which the signal is distributed. FIGS. 7-10 illustrate device 700 using a microstrip to ground plane transient signal t-line and a plurality of sampling and charge input sites distributed along a buried CCD transfer channel. FIG. 10 illustrates the device 700 schematically, together with its associated support circuitry (which associated circuitry may be of generally conventional design). As shown in FIG. 10, the device 700 includes a buried channel CCD register 1010 and a serpentine configured transmission line 702. The transmission line 702 is a single ended transmission line with the ground plane being the substrate (althrough coplanar t-line leads, and/or loops may be desirably utilized with appropriate attention to interface design). The signal source to be recorded is designated as element 1002, and the signal therefrom is applied to one end of the transmission line 702. The other end of transmission line 702 may desirably be routed off the device chip, and be terminated in its respective charactertistic impedance Zo. Another on-chip transmission line 704, designated herein as the control line, is connected to an external pulse, or impulse generator element 1004. The other end of the control transmission line 704 is similarly brought off-chip and terminated in its characteristic impedance, Zo.

An output amplifier 1006 for the slow CCD register output, which may desirably be a single on-chip FET amplifier, is provided to convert charge packet information to a suitable output signal in accordance with conventional practice. The output of amplifier 1006 is provided as an input signal to an analog-to-digital converter 1008, which may similarly be of conventional design. Despite the high speed signal sampling design of the device 700, the output operation of the CCD register and the output data rate of the device 700 may be at a very low rate (e.g., 100 kHz) which simplifies design constraints of the device.

Turning now to FIG. 7, the construction of device 700 will now be more particularly described with respect to specific CCD cell elements, a plurality of which (e.g., 200 or more) may be utilized in the device 700. The device 700 is provided with structures (not shown), which may be of conventional design.

The illustrated embodiment 700 utilizes a four phase transport overlapping electrode clocking architecture of conventional design, and in this regard, transport electrodes 714, 715, 716 and 718 are respectively phase 1, 2, 3 and 4 gate elements of the four phase transferring structure of the output of the slow CCD shift register.

At predetermined locations along the signal transmission line 702, the line 702 is brought to sampler sites, which are associated with transmission channel cells at regular intervals along the CCD transfer register. Similarly, the control gate transmission line 704 also intercepts the sampler sites at these predetermined locations along the line 704.

Each sampling site of the device 700 is also provided with a sink diffusion 710, as part of a charge input structure, the operation of which will be explained in more detail hereinafter. The input structure further includes a regulator gate 708 and storage gate 706. The device 700 is also provided with channel stop 712, which contains charge in the various parts of the sampling structure and also defines the transfer channel of the CCD transfer register. As illustrated in FIG. 7, it will be appreciated that channel stop 712 has an "H" shape which is adapted to contain charge in the unused cell in the CCD shift register that is a cross member of the "H". The vertical legs of the "H" contain charge in the sampling structure. The channel stop 712 projects under the electrodes to ensure that charge is transferred from the sampling structure into the accumulation cells of the CCD register cells without lateral transfer into some other region.

FIG. 8 is a cross sectional view of one of the sampler cells of the device 700 taken through line 8—8, and the operation of this sampling cell element of the device 700 will now be more particularly described with respect to FIG. 8. It should be noted that while the illustrated electrodes are shown simplistically for purposes of illustration, the electrodes of the device 700 are provided with an overlapping structure in accordance with conventional practice.

When the CCD structure is initially activated, both the storage well and the accumulation well in the structures are filled with charge, as shown schematically in State A. The charge is then removed from the accumulation sites in the CCD registers by clocking all the charge out serially through the output structure of the CCD register, to produce an operational condition as generally shown by State B of FIG. 8 in which the accumulation wells are empty and the storage wells are filled with charge up to the potential level determined by the regulator gate element 708. Thermal filling will act to try to constantly accumulate charge, but as it does, the extra charge will be spilled out over the regulator gate 708 into the sink diffusion. In this manner, a constant quantity of charge is maintained under the storage electrode 706 at a potential which is less than the potential necessary to cross the gate electrode 704 in the non-sampling state of the device 700. During this process, electrode 704 is held at a potential such that the well thereunder is above (i.e., more negative in a buried n-channel device) the charge level, thereby preventing any charge spillage into the accumulation well under the accumulation electrode 716.

State C of FIG. 8 illustrates the effect of a change in potential on the regulator gate 708, which is stepped up in potential to provide for charge movement in the storage site without charge spilling back over the regulator gate 708. This is done just prior to initiation of the sampling mode in respect to sampling of the signal of interest applied to t-line 702. The time interval between the raising of the potential of gate 708, and the triggering of the sampling mode should be small with respect to the time constant for thermal generation of carriers, so that the quantity of charge remaining relatively constant.

The sampling of data is initiated by the potential under control gate 704 abruptly being dropped "low" (using the reverse potential notation common for buried n-channel CCD description) and allowing charge to spill across the signal gate 702, into and also across the control gate 704, and into the accumulation well 716. The rate at which charge spills into the accumulation well 716 is determined by the potential on the signal gate electrode 702, which acts to regulate the rate of charge flow. The flow process will continue as long as the control gate electrode is low and therefore, the effective signal integration time may be controlled to some degree by the width (in time) of the pulse which is applied to the control gate electrode 704. This width should be made small enough so that charge has not completely spilled down to the potential on the signal electrode 702 such that charge would stop flowing. The sampling procedure is terminated by abruptly bringing the control gate potential applied to control gate 704 abruptly back up as shown in State E. At this point, some quantity of charge representation of the signal present of the signal electrode 702 at the time and point of sampling has been shifted over into the accumulation well under electrode 716 and isolated from the charge in the storage well. This quantity of charge is a function of the duration of the control pulse as it travels along control electrode 704, and the signal voltage present on signal t-line 702 at the sampling locations during the time of the control gate pulse.

FIG. 7 shows two sampling cells disposed along the linear CCD register, and it can be seen that the transmission line 702 is provided with a serpentine path such that its length may be varied independently of the length of the CCD cell elements along the CCD transfer channel. By increasing or decreasing the length of the "legs" of the t-line 702 (in different devices) in a direction away from the CCD channel, the sampling speed (effective time interval between samples) may be respectively increased or decreased. The t-line 702 should be provided with corner and interface construction such that propagation reflections or other losses are minimized.

In the illustrated embodiment 700, the sampling sites are located at every other four-phase cell of the CCD register. However, the sampling site spacing may also be varied. For example, the CCD register with more spacing between sampling sites may be convenient to make the corners and turns in the transmission line and to provide desired isolation between the parallel lines extending to and from the CCD sampling sites. For example, in other embodiments, sampling sites may be disposed at multiples of 3, 4 or more four phase cells of the device 700.

When the signal to be sampled is applied to one end of transmission line 702, the signal then propagates down the line 702 so that a time function of the signal is applied across the length of the transmission line 702 as a voltage distribution across the line, because of the finite length of time that it takes the signal to travel from signal input means 1002 to the termination of the transmission line. After the beginning of the signal function segment to be recorded has propagated across the full length of the line 702, then the signal function duration to be measured is generally distributed across the length of the transmission line 702 disposed adjacent sampling sites along the CCD transmission channel. At this point in time, a sampling control pulse is applied to control line 704 by generator 1004, as best shown in FIG. 10. As this preferably squarewave control pulse propagates to each of the sampling sites, which it does at a rate faster than the site-to-site propagation rate along the t-line 702 because its length is much shorter than that of line 702, a sample is taken at each site which will be proportional to the voltage at each sampling point along line 702 of the signal to be measured. In the illustrated embodiment, the sampling signal applied to line 704 is propagated in a direction opposite to the propagation direction of the signal to be sampled. The sampling speed may also be varied for a given device by applying the sampling signal in the same direction as the signal which is propagating along transmission line 702. As soon as the pulse then generated at 1004 has propagated across the length of line 704 and reaches the end termination point, the sampling process has been completed. All the samples of the signal are contained in the form of charge packets which have been accumulated into the accumulation cells of the CCD register adjacent the respective sampling sites. The number of samples directly corresponds to the number of sampling cell units provided in the device 700. The charge packet sample data then may be transferred at a relatively slow rate, serially out of the CCD register into a charge to voltage converter, as previously described through an amplifier 1006. The output may be transmitted to an analog to digital converter 1008, and placed into digital memory.

While one operational mode and structure has been described in regard to the device 700 of FIGS. 7–10, various alternative modes and structures may be provided utilizing the principles of operation of the device 700, for example, the functions of transmission lines 702 and 704 may be exchanged such that the signal to be sampled would propagate along the length of the t-line 704, and the control signal pulse will propagate along t-line 702. This has the advantage that the shorter line length would cause less degradation of the signal to be sampled for the same total recording length. However, the sampling control pulse would be subjected to some correspondingly increased degradation. Similarly, while uniform input charge wells have been utilized in the embodiment 700, it will be appreciated that the well potential prior to sampling may be varied at each sampling site, to provide signal correlation sampling or correction, as previously discussed. Similarly, while input wells have been described, input diffusions maintained at a specified uniform (or site-to-site varying) potential may also be utilized.

Another sampling structure for use in a device like device 700 of FIGS. 7–10 is illustrated in FIG. 11. The sampling structure embodiment 1100 illustrated in FIG. 11 includes an accumulation gate 1102, a signal gate 1104, storage gate 1106, and a regulator gate 1108. The control gate has been eliminated because in the operation of device 1100, the control pulse is applied to the storage gate 1106, and the regulator gate 1108 also. In this regard, both 1106 and 1108 act as control gate transmission lines with respect to substrate, and propagate the same control pulse in the sampling process.

State A of FIG. 11 illustrates the starting condition of the device 1100, where the storage gate 1106 is filled with charge up to the regulator gate 1108 potential, and the accumulation gate 1102 is empty. The sampling process is initiated by applying the control pulse to the storage gate 1106 and regulator gate 1108 and shifting the potentials upward, as indicated by State B of FIG. 11. When this occurs, the charge is actually moved up to a higher (i.e., more negative) potential and begins to flow over the signal potential, such that the rate of flow is modulated or controlled by the voltage present on signal gate 1104. Charge accumulates in the accumulation well along the CCD transport channel for the duration of the control pulse time width, applied to the storage and regulator gates, which accordingly also thereby provides a control gate function. When the control pulse ends, the potential under the storage gate 1106 and regulator gate 1108 suddenly drops low again, such that charge stops flowing across the signal gate 1104 as shown by State C of FIG. 11. Accordingly, in the operation of the device 1100, the signal is applied to gate 1104 and the sampling process is controlled by the control pulse applied to gate 1106 and 1108, which act to shift the storage charge up above the potential 1104 during sampling and then shift it down below the potential of gate 1104 before and after sampling. The signal to be sampled is continuously applied to gate 1104. In this manner, one of the gate elements between the storage well and the accumulation well is eliminated, which shortens the distance that the charge must travel to the accumulation well, thereby providing a faster, more signal responsive structure.

FIG. 12 illustrates yet a different mode of sampler operation and construction 1200 for a device like that of FIGS. 7-10. This mode of operation is particularly adapted for sampling a signal function, which initially is at some base line voltage until the data of interest is encountered, which suddenly changes this voltage in a known direction. This is a typical form of transient data associated, for example, with laser device measurements in which a large signal spike is presented to the transient data recorder, which spike is the data of interest.

FIG. 12 shows a signal function 1220 which initially is at some base line voltage and remains at such potential, until the data of interest is propagated along the t-line and suddenly changes this voltage.

The spiked data slope of such a special, but common class of transient data signals may be utilized to initiate the sampling process. In this regard, when the signal to be recorded suddenly begins to move off its base line, sampling may be initiated automatically by this change in potential, which cause charge to begin flowing under 1202 as illustrated in FIG. 12B. The end of sampling integration process or interval will be controlled by a control signal, which is not a pulse, but rather a step function, as shown in 1230. The step control pulse will be initiated at a predetermined time from the initiation of the signal rise, which time will correspond to the sampling capacity of the device 1200.

The main advantage of this approach is that while it is restrictive in the type of data it can record, it utilizes only a very fast step control pulse, which in some cases is much easier to generate than an impulse or a control pulse with both a very fast rise and very fast falling edge.

FIG. 12 illustrates the implementation of such a structure 1200 in cross section, comprising accumulation gate 1202, signal gate 1204, storage gate 1206 and regulator gate 1208. State A then depicts the starting condition with the accumulation well under electrode 1202 empty and the storage well under electrode 1206 filled up to the regulator potential level. State B corresponds to the point 1210 of the transient data signal rise, where the signal has now suddenly moved above a predetermined voltage indicating a data spike is developing which is to be recorded. At this point, potential 1204 has moved down such that charge is beginning to spill across it into 1202. This process will continue to occur in a manner proportional to signal until the time indicated at 1212, at which point the control step is applied to electrode 1206, and abruptly drops the potential under gate 1206 down well below the potential under gate 1204 to stop the sampling procedure.

Another sampling structure 1900 similar to that of FIG. 7 in configuration, but operationally different, is shown from a top view in FIG. 19. The device 1900 will, in addition to output structures (not shown) which may be of conventional design, also is provided with a charge input structure (not shown) for imparting charge packets to the transfer channel, which may also be of conventional design as in device 100. As in FIG. 7, a transient signal transmission line 1902 propagates signal to multiple sampler sites. A control pulse is propagated to each sampler site via transmission line 1904. Charge is contained within the sampler site and CCD register cell, with a conventional channel stop diffusion 1906. A cross sectional view of the sampler cell, as indicated by line 20—20 in FIG. 19, is shown in FIG. 20 along with a series of potential/charge state diagrams which will be used to describe operation.

In FIG. 20, the cell structure comprises of a register gate 1910, a control gate 1904, and a signal gate 1902 placed over an oxide layer 1912, which is on top of the semiconductor material 1914. In operation, all charge within the sampler sites is initially removed by serially shifting it out to the conventional output structure by means of the four phase trasnport electrode system. Measured packets of charge are then generated at a conventional input structure, as has previously been described, and shifted into each sampler site (e.g., under register gate 1910), as is shown in FIG. 20, State A. Intervening cells are not provided with charge packets (or are provided only with "fat zero" packets if this operational mode is used). The control gate 1904 barrier is then dropped, allowing the measured charge to flow across and under 1904 and 1902. As the transient signal voltage varies on gate 1902, charge will distribute accordingly in a manner which tracks the signal voltage. State C shows the potential barrier under gate 1904 being raised, to initiate a sample, such that the charge packet is split into two isolated copackets under gates 1910 and 1902 of FIG. 20.

After the samples have been taken in this manner, the copackets under the sampling site electrodes (e.g., electrode 1910) are shifted to the right one cell in the CCD register, a cell consisting of four adjacent electrodes as can be seen in FIG. 19, items 1908, 1909, 1910 and 1911. The second copacket under 1902 can then be moved to under gate 1910 (which initially has zero, or "fat zero" charge), as shown in States D and E by dropping the barrier under gate 1904. Both copackets now reside in separated cells with the CCD register and may be transferred out serially, to the output structure. As previously discussed, the charge packet metered into the sampling sites may also be intentionally nonuniform to represent a correlation signal function for correlation sampling.

Figure 13:
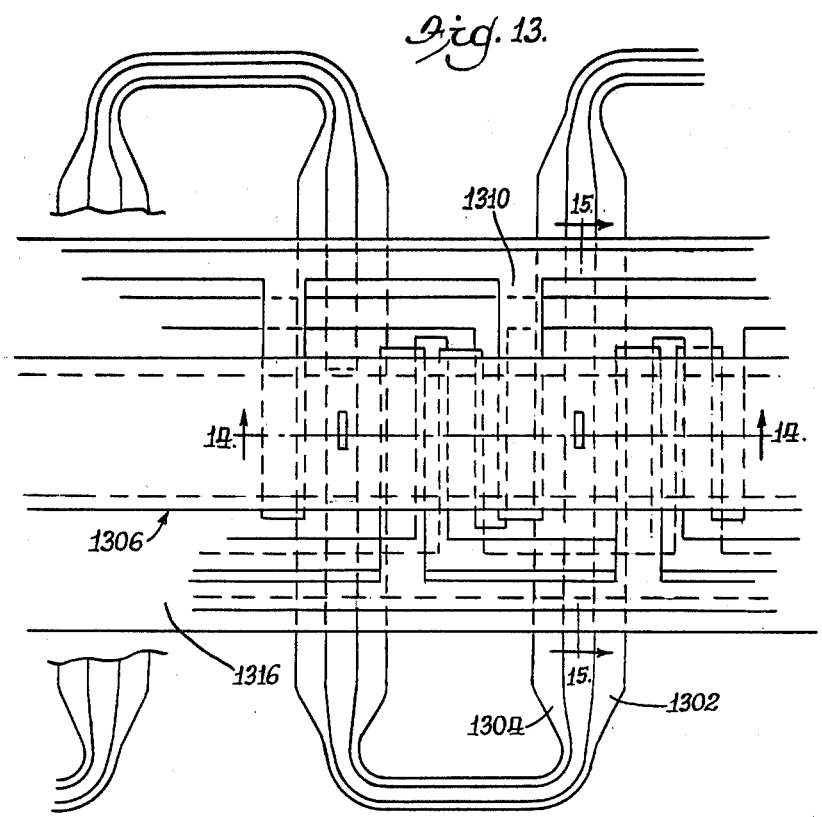
FIG. 13 is a top view, partially broken away, of another embodiment of very high speed signal recording device.

A further embodiment 1300 of a t-line charge partitioning device utilizing an orthogonal cell structure in which the transmission line(s) cross the charge transfer device channel at right angles is shown in FIG. 13. The illustrated device utilizes a buried channel, four phase CCD structure, with the transmission lines configured as parallel transmission lines 1302, 1304 disposed on the surface of the device. In this regard, in the illustrated embodiment 100, transmission lines 1302 and 1304 cross the CCD transmission channel through two gate fingers represented by two lower level gate fingers 1302, 1304 separated by an upper level gate finger 1306. To each side of the transmission line 1302, 1304 crossing in the CCD transfer channel, are other upper level gate fingers 1308, 1310 which serve as barriers during the time of data acquisition. Conventional four phase CCD gate fingers 1312, 1314, 1316 connected to rails over the channel stops 1316 are also provided in the device 1300. The device 1300 further comprises conventional input and output structures, which need not be further described.

Figure 14:
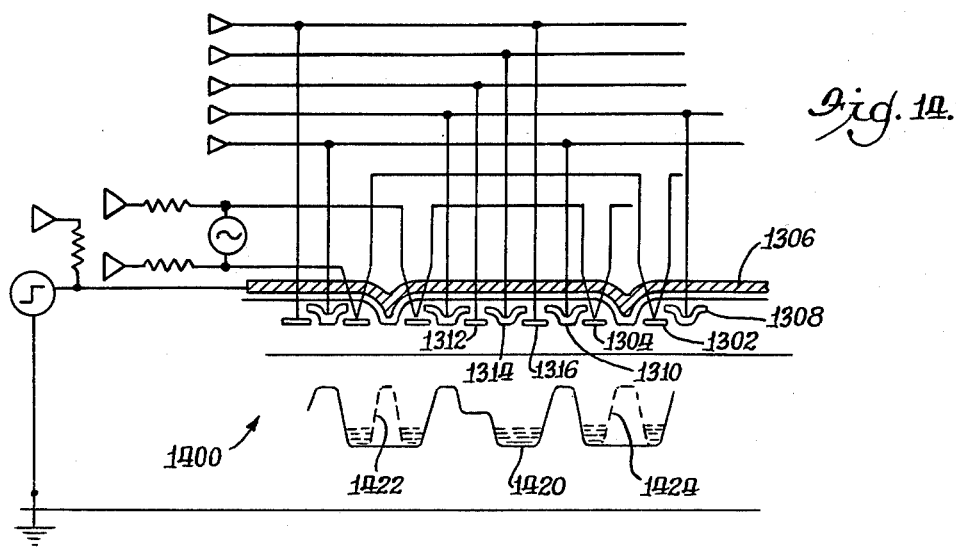
FIG. 14 is a cross sectional side view of two charge partitioning cells of the device of FIG. 13, taken through line 14—14, generally in registration with FIG. 13.
Figure 15:
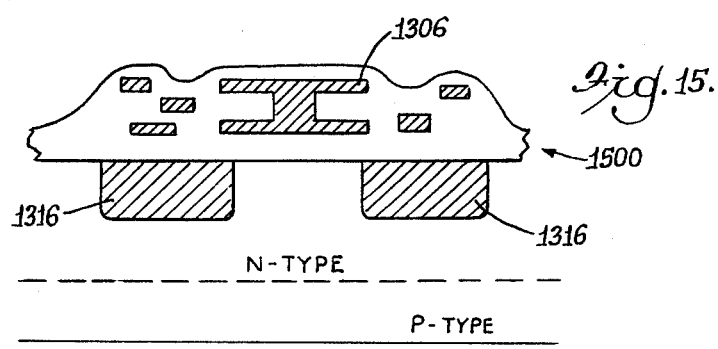
FIG. 15 is a cross sectional side view of the device of FIG. 13, taken through line 15—15.

A cutter gate 1306 is also provided, which forms a transmission line along the top of the CCD gate structure with the device substrate and which periodically forms an electrode element along the CCD transport channel, as best illustrated in FIG. 14. Cutter gate 1306 must be a good conductor so that it can sustain a sharp edge for a step type sampling pulse, along the entire length of the CCD device 1300. The parallel transmission line 1302, 1304 may vary in length, while the cutter gate is disposed straight down the CCD to provide a equal, controlled difference in time of propagation from cell to cell for the cutter gate and signal path.

The channel stop may be implemented with a heavily doped semiconductive implant ring surrounding the CCD structure, an undoped semiconductive region surrounding the CCD structure, or a potential barier generating gate electrode above the oxide layer. In the illustrated embodiment 1300, an implant 1316 is utilized to simplify device fabrication.

In operation of the device 1300, the signal to be recorded is applied as a balanced signal between t-lines 1302 and 1304, which are brought to the side of the chip and brought off as a parallel transmission line.

In use, charge is clocked into the CCD on a four phase basis on every other cell, as shown in FIG. 14, by appropriate off-chip drivers. Then the CCD charge propagation is stopped with the charge packets under a cutter gate electrode element. The cutter gate potential is then lowered via its controlling voltage, as is the transmission line electrode, to form a three gate finger wide well under the parallel transmission line as it crosses the CCD, represented as numeral 1420 in FIG. 14. The charge in each well is free to equilibrate under the influence of prevailing electric field conditions. When a balanced AC signal is applied to electrodes 1302 and 1304, the potential functions and resulting electric fields are altered and the charge redistributes within the well in response to these altered conditions. The charge continues to redistribute in a manner which tracks the signal in the transmission line at that location. At the time it is desired to sample the voltage in the parallel transmission line, a sharp step is transmitted down the cutter gate line 1306 which causes the potential of electrode 1306 to rise, splitting the charge (leaving some under gate 1302 and some under gate 1304 as shown in the schematic of the illustrated potential wells 1422, 1424 at the bottom of FIG. 13).

At that point, the charge remains separated and with a first transition of one of the side barriers, the extra charge is shifted over into the adjacent cell. It is then clocked out in an iregular four phase manner, in which the transmission lines are used as transport electrodes.

The charge packets are read out of the device through a conventional amplifier and normal signal processing.

While the illustrated embodiment 1400 utilizes a balanced transmission line, a microstrip over ground plane transmission line may also be utilized as an electrode element in an orthogonal array. In this case, fringing fields are provided to influence charge redistribution, and the partitioned charge may be more conventionally clocked out of the device.

Figure 16:
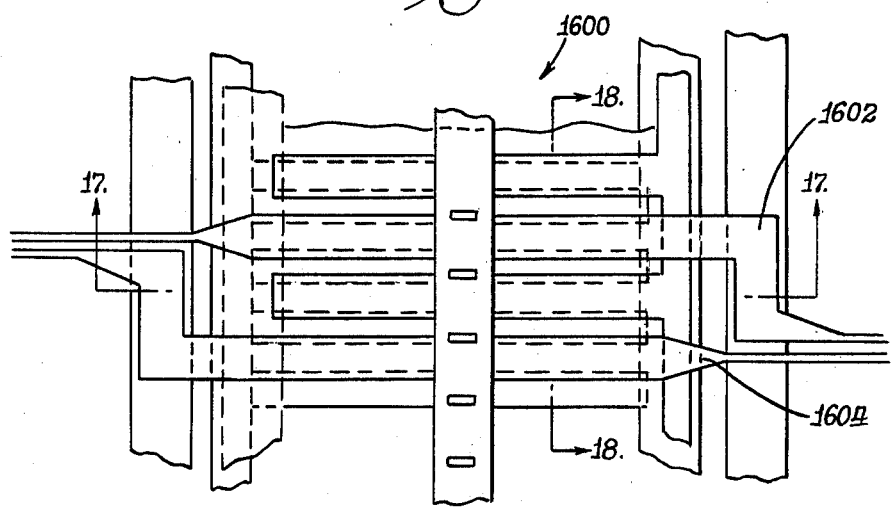
FIG. 16 is a top view of a data cell element of another embodiment of a high speed charge partitioning integrated circuit device, similar to the device of FIG. 1.
Figure 17:
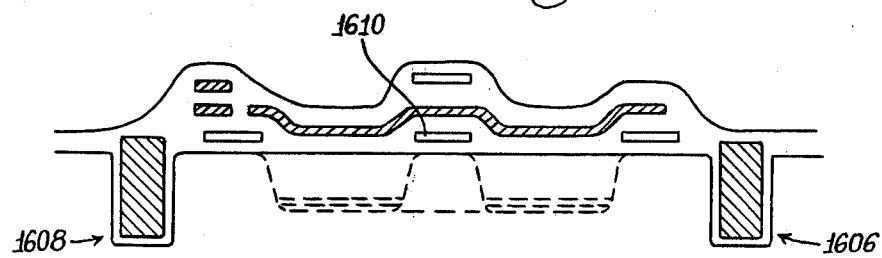
FIG. 17 is a cross sectional front view of the device of FIG. 16 taken through line 17—17, and in general registration with FIG. 16.
Figure 18:
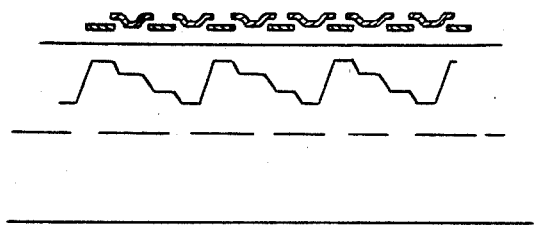
FIG. 18 is a cross sectional side view of the device of FIG. 16 taken through line 18—18, and which is in general registration with FIG. 16.

FIG. 16 illustrates the central sampling portion of a further orthogonal cell embodiment 1600 which is similar to embodiment 100 of FIG. 1. However, in embodiment 1600 of FIG. 16, the parallel transmission lines 1602 and 1604 cross through the CCD on the same phase in two different cells in a parallel manner. That is to say, that if it is a four phase device, transmission lines 1604, 1606 both cross through on phase one, but in two different cells of the CCD, weaving three other fingers of the four phase transport electrode system in between. In this case, charge is shifted laterally as in device 100 of FIG. 1, and a cutter gate 1610 is used to partition charge. The lateral shifting is accomplished from the parallel transmission line by letting one electrode dip down into the deep side well on one side and the other electrode dips down into the deep channel on the other side of the same charge well. Thus, for one cell length, the structure of a colinear cell is simulated, but yet the signal is applied across the CCD cell in the same direction as in device 100 of FIG. 1, parallel to the channel for a short distance, to provide field to laterally drive the charge in the same manner as described in FIG. 1. Because of this crossing through a deep notch on the side of the CCD potential well, a "V" construction may best be used rather than a "U" construction, in that it is easier to provide step crossings in device fabrication.

Accordingly, it will be appreciated that in accordance with the present invention, methods and devices are provided which are adapted for extremely rapid signal sampling and processing. While particular aspects of the invention have been described with respect to certain specific embodiments, it will be appreciated that numerous modifications, adaptations and variations will become apparent from the present disclosure, and are intended to be within the spirit and scope of the present invention as defined by the following claims.

Various of the features of the invention are set forth in the following claims.

What is claimed is:

1. An integrated circuit device for recording transient data signals comprising,
   charge transfer channel means for providing a plurality of charge potential wells at a plurality of sampling sites disposed along a charge transfer channel, and for transferring charge carrier packets along said channel,
   an electrical transient data signal transmission line means disposed at least in part along said transfer channel means at said sampling sites, for receiving an electrical transient data signal to be recorded and for propagating said electrical transient data signal successively to each of said plurality of sampling sites such that said electrical transient data signal propagated thereon is distributed along said transmission line means to apply the electric field of said transient data signal distributed thereon to charge carriers at each respective sampling site, and means for transferring and isolating charge carriers at a selected sampling time when a transient data signal to be recorded is distributed along said transmission line at each of said charge potential wells in response to the transient data signal potential provided by said transmission line means at each of said respective sampling sites to thereby provide charge packets of charge carriers disposed along said charge transfer channel which record said electrical transient data signal.

2. A device in accordance with claim 1 further including means in charge transfer communication with said charge transfer channel means for measuring charge packets and for providing an output signal corresponding to the quantity of charge transferred thereto.

3. A device in accordance with claim 1 wherein said transfer channel means comprises an n-type buried CCD transfer channel wherein said transmission line means comprises a balanced transmission line comprising two buried transmission gates, wherein said sampling sites are disposed between said buried transmission gates of said balanced transmission line, and wherein said means for transferring and isolating charge carriers comprises cutter gate means for dividing potential wells containing charge at said sampling sites into a plurality of at least two separate potential wells containing charge distributed therein under the influence of said respective sampling site transmission line electric fields.

4. A device in accordance with claim 1 wherein said charge transfer channel means comprises an n-type buried CCD transfer channel, and wherein said means for transferring and isolating charge comprises a charge carrier source at a predetermined potential at each of said sampling sites and a control gate transmission line for transmitting a sampling control signal for metering charge from said charge carrier sources to said charge potential wells under the metering influence of said respective transmission line means transient data fields.

5. A device in accordance with claim 1 wherein said charge transfer channel means comprises an n-type buried CCD transfer channel, wherein said transmission line means forms a potential well at each sampling site adjacent said charge transfer channel, and wherein said transferring and isolating means comprises a control gate transmission line for controlling charge transfer between said sampling site potential wells and said adjacent transmission line means.

6. A device in accordance with claim 1 further comprising means for inputing charge packets of substantially uniform size to said charge transfer channel for disposition at said sampling sites prior to propagation of a transient data signal to be recorded along said electrical transmission line means.

7. A device in accordance with claim 1, further comprising means for inputing charge packets of predetermined non-uniform size to said charge transfer channel for disposition at said sampling sites prior to propagation of a transient data signal to be recorded along said electrical transmission line means.

8. A device in accordance with claim 1 wherein said transmission line means comprises a serpentine transmission line array.

9. A method for recording transient data signals comprising the steps of
providing a plurality of charge potential wells at a plurality of sampling sites disposed along a charge transfer channel,
propagating a transient electrical data signal to be recorded along an electrical transmission line sequentially to each of said plurality of sampling sites to distribute the transient data electrical data signal along the respective sampling sites such that the electric field potential of the distributed transient data signal is applied to each respective sampling site such that a representation of the electric field of the transient data signal in time is provided along of said sampling sites, transferring charge carriers at a selected sampling time at each of said charge potential wells under the influence of said respective transient data signal electrical fields at each of said sampling sites to provide analog charge packets of charge carriers respectively at each sampling site representative of the electric field of the transient data signal at each such site at said respective sampling time, and
isolating said analog charge packets to provide an analog record of said transient data signal.

10. A method in accordance with claim 9 wherein said transfer of charge carriers is carried out by partitioning charge carriers tracking a respective transmission line transient data field in a potential well into at least two potential wells, and subsequently measuring said partitioned charge carriers.

11. A method in accordance with claim 9 wherein said transfer of charge carriers is carried out by metering charge from a charge source to a potential well under control of the transient data signal electrical field at each respective sampling site, and subsequently measuring said metered charge carriers.

12. A method in accordance with claim 10 wherein a plurality of charge packets are generated and propagated to said respective sampling sites prior to said sampling time, wherein a potential well is formed at each sampling site under a portion of said transmission line, a portion of a control line transmission electrode, and at least one transport electrode of said transfer channel, and wherein said partitioning is carried out by applying a control signal to said control line transmission electrode.

* * * * *